(12) United States Patent
Shi et al.

(10) Patent No.: US 7,977,111 B2
(45) Date of Patent: Jul. 12, 2011

(54) DEVICES USING ADDRESSABLE MAGNETIC TUNNEL JUNCTION ARRAY TO DETECT MAGNETIC PARTICLES

(75) Inventors: Xizeng Shi, Fremont, CA (US); Pokang Wang, San Jose, CA (US); Hsu Kai Yang, Pleasanton, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 560 days.

(21) Appl. No.: 12/009,366

(22) Filed: Jan. 18, 2008

(65) Prior Publication Data

US 2009/0186770 A1 Jul. 23, 2009

(51) Int. Cl.
*G01N 25/18* (2006.01)
(52) U.S. Cl. ........ 436/149; 436/526; 436/151; 436/806; 429/10; 435/287.1
(58) Field of Classification Search .................. None
See application file for complete search history.

(56) References Cited

U.S. PATENT DOCUMENTS

| | | | |
|---|---|---|---|
| 5,835,314 A | 11/1998 | Moodera et al. | |
| 5,981,297 A | 11/1999 | Baselt | |
| 6,731,477 B2 | 5/2004 | Lin et al. | |
| 6,764,861 B2 | 7/2004 | Prinz et al. | |
| 6,844,202 B2 | 1/2005 | Prinz et al. | |
| 6,875,621 B2 | 4/2005 | Tondra | |
| 7,031,186 B2 | 4/2006 | Kang et al. | |
| 2002/0197739 A1 | 12/2002 | Prinz et al. | |
| 2003/0179511 A1* | 9/2003 | Xiao et al. | 360/324.2 |
| 2004/0018644 A1 | 1/2004 | Johnson et al. | |
| 2004/0120185 A1 | 6/2004 | Kang et al. | |
| 2005/0100930 A1 | 5/2005 | Wang et al. | |
| 2005/0258821 A1 | 11/2005 | Wang et al. | |
| 2007/0114180 A1 | 5/2007 | Ramanathan et al. | |
| 2007/0154881 A1 | 7/2007 | Koo | |
| 2007/0159175 A1 | 7/2007 | Prins | |
| 2007/0281079 A1 | 12/2007 | Carey et al. | |

FOREIGN PATENT DOCUMENTS

WO PCT/US 09/00302 3/2009

* cited by examiner

*Primary Examiner* — N. C. Yang
(74) *Attorney, Agent, or Firm* — Saile Ackerman LLC; Stephen B. Ackerman

(57) ABSTRACT

A magnetic sensor for identifying small superparamagnetic particles bonded to a substrate contains a regular orthogonal array of MTJ cells formed beneath that substrate. A magnetic field imposed on the particle, perpendicular to the substrate, induces a magnetic field that has a component within the MTJ cells that is along the plane of the MTJ free layer. If that free layer has a low switching threshold, the induced field of the particle will create resistance changes in a group of MTJ cells that lie beneath it. These resistance changes will be distributed in a characteristic formation or signature that will indicate the presence of the particle. If the particle's field is insufficient to produce the free layer switching, then a biasing field can be added in the direction of the hard axis and the combination of this field and the induced field allows the presence of the particle to be determined.

42 Claims, 6 Drawing Sheets

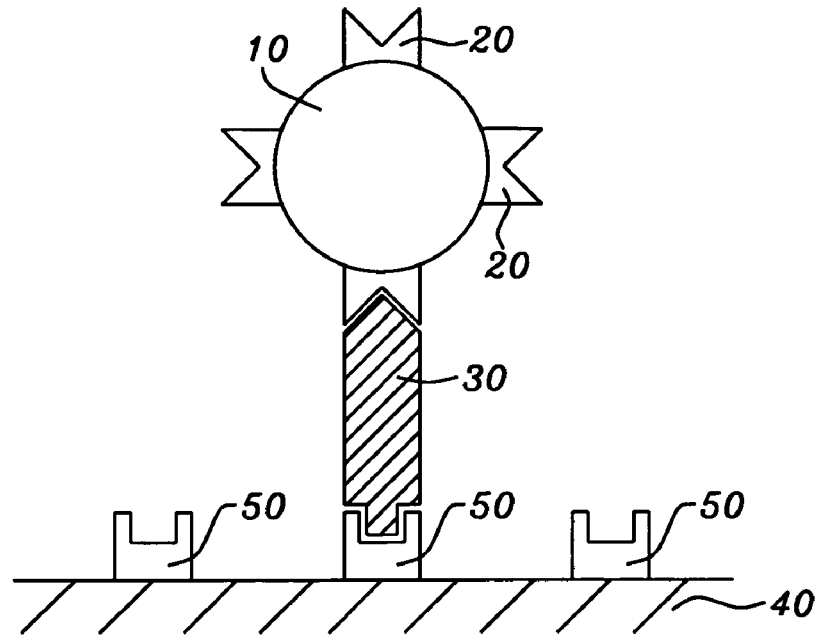
FIG. 1 – Prior Art
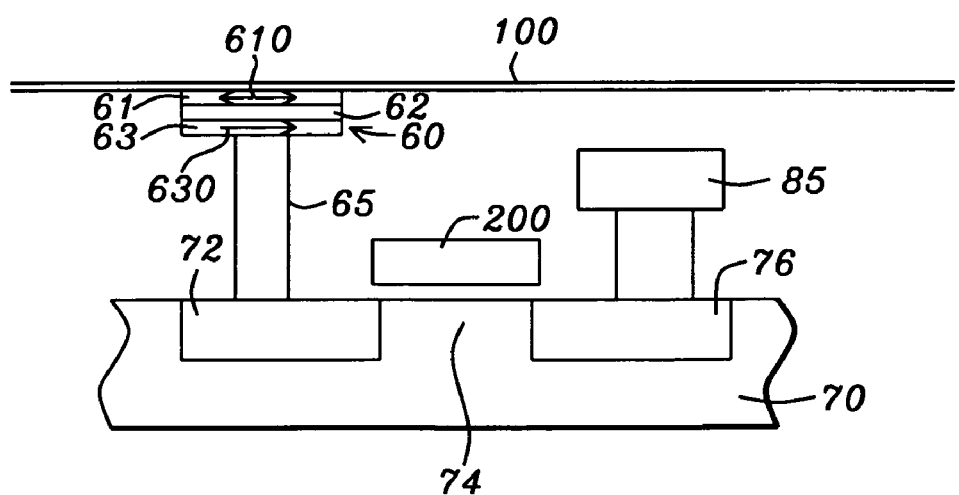
FIG. 2 – Prior Art

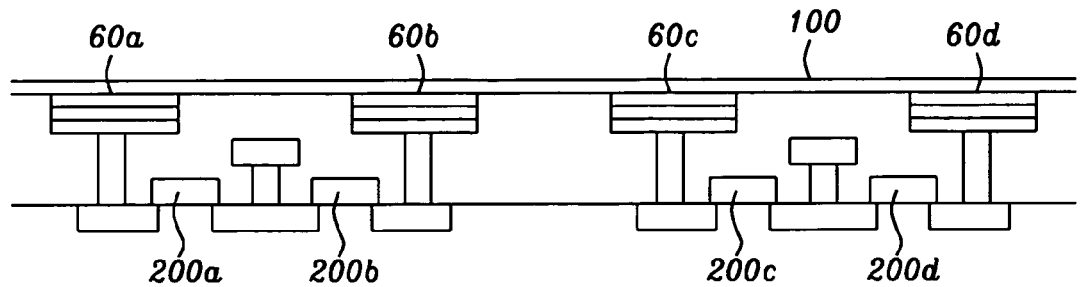
FIG. 3 - Prior Art
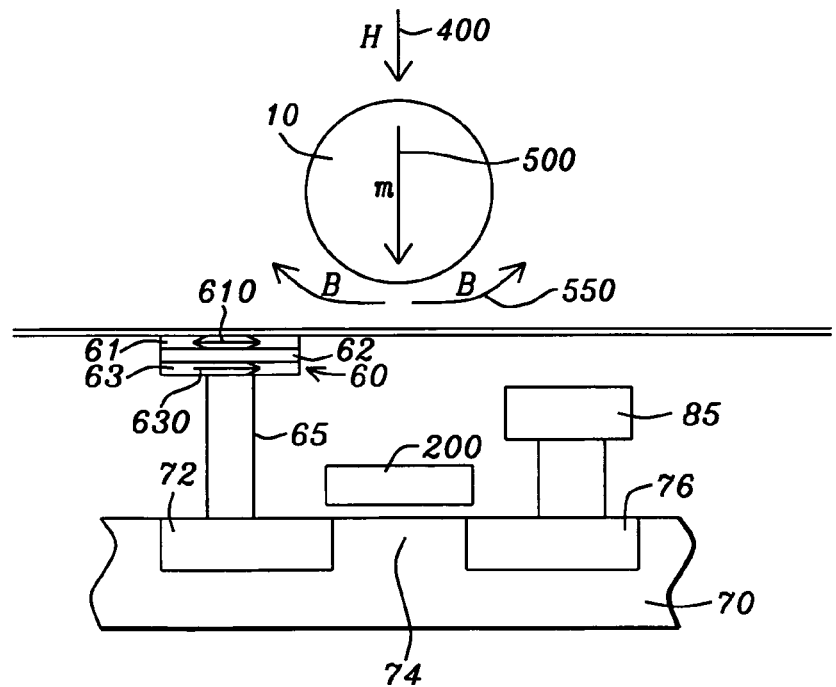
FIG. 4 - Prior Art

DEVICES USING ADDRESSABLE MAGNETIC TUNNEL JUNCTION ARRAY TO DETECT MAGNETIC PARTICLES

BACKGROUND OF THE INVENTION

1. Field of the Invention

This invention relates to the detection of small magnetized particles (beads) by a magnetic sensor, particularly when such particles or beads are attached to molecules whose presence or absence is to be determined in a chemical or biological assay.

2. Description of the Related Art

Magnetic devices have been proposed as effective sensors to detect the presence of specific chemical and biological molecules (the "target molecules") when, for example, such target molecules are a part of a fluid mixture that includes other molecules whose detection is not necessarily of interest. The basic method underlying such magnetic detection of molecules first requires the attachment of small magnetic (or magnetizable) particles (sometimes denoted "beads") to all the molecules in the mixture that contains the target molecules. Because of their small size these particles are "superparamagnetic", meaning they ordinarily maintain no meaningful magnetic moment. However, when placed in an external magnetic field, these particles develop an induced magnetic moment and can produce a corresponding magnetic field.

The magnetic beads are made to attach to the molecules by coating the beads with a chemical or biological species that binds (e.g. by covalent bonding) to the molecules in the mixture. Then, a surface (i.e., a solid substrate) is provided on which there has been affixed receptor sites (specific molecules) to which only the target molecules will bond. After the mixture has been placed in contact with the surface so that the target molecules have bonded to it, the surface can be flushed in some manner to remove all unbonded molecules. Because the bonded target molecules are equipped with the attached magnetic beads, it is only necessary to detect the magnetic beads to be able, at the same time, to assess the number of captured target molecules. Thus, the magnetic beads are simply "flags," which can be easily detected (and counted) once the target molecules have been captured by chemical bonding to the receptor sites on the surface. The issue, then, is to provide an effective method of detecting the small magnetic beads, since the detection of the beads is tantamount to detection of the target molecules.

One prior art method of detecting small magnetic beads affixed to molecules bonded to receptor sites is to position a magnetic sensor device beneath them; for example, to position it beneath the substrate surface on which the receptor sites have been placed.

FIG. 1 is a highly schematic diagram (typical of the prior art methodology) showing a magnetic bead (10) covered with receptor sites (20) that are specific to bonding with a target molecule (30) (shown shaded) which has already bonded to one of the sites. A substrate (40) is covered with receptor sites (50) that are also specific to the target molecule (30) and those sites should, in general, be different from the sites that bond the magnetic particle to the molecule. The target molecule (30) is shown bonded to one of the receptor sites (50) on the surface.

Referring to FIG. 2, there is shown a prior art magnetic sensor (60), similar to a structure used in magnetic random access memory (MRAM), that can be positioned beneath the receptor site of FIG. 1. As shown schematically in the cross-sectional view of FIG. 2, the prior art sensor (60) is a magnetic tunneling junction (MTJ), that includes a magnetized "free" layer (61) whose magnetization direction (610) is free to move and a magnetized "pinned" layer (63) whose magnetization (630) is fixed in direction. The two layers are separated by a thin, non-magnetic and electrically non-conducting layer (62), the tunneling barrier layer. The sensor is incorporated within a circuit that can detect changes in the magnetic direction of the free layer relative to the pinned layer, by sensing the changes in the resistance of the sensor, which change is a function of the change in the relative directions of the two directions. The circuit includes a selection transistor (70) having a source region (72) to which the sensor element (60) is electrically connected (65), a gate region (74) over which runs a conducting wordline (200) that can effectively activate the gate and allow a sensing current between the source (72) and a grounded (85) drain (76). An electrically conducting bitline (100) contacts the top surface of the sensor to external circuitry and can provide the sensing current that passes between source and drain, thereby effectively measuring the resistance of the sensor.

Referring to FIG. 3, there is shown a portion of a prior art MTJ array, formed by a regular repetition of the single circuit structure in FIG. 2. Four MTJ elements are shown (60a), (60b), (60c) and (60d) that are contacted by a common bitline (100) and accessed by four wordlines (200a), (200b), (200c) and (200d).

Referring to FIG. 4, there is shown an externally magnetized bead (10) positioned above an MTJ element (60), such the element of FIG. 2. Although the external field, H (arrows (400)) can be strong, it is directed perpendicularly to the plane of the magnetic moments (arrows (610) and (630)) of both the free and pinned layers of the sensor and, therefore, does not have an effect on their relative orientations. On the other hand, the field, H (400), induces a magnetic moment M (500) in the bead that, in turn, produces field lines, B (550) azimuthally surrounding the bead. The directions of B include components that are tangent to the plane of the free (61) layer of the element and that, therefore, can change the direction of the free layer magnetization (610). Such changes will produce detectable variations of the sensor's resistance and, in the case of an array of sensors and a large number of bound molecules with their magnetized beads, the overall resistance change of the array can be measured and the total number of captured molecules can be inferred.

Because the field, B, produced by the magnetized bead is fairly small, it is imperative to design MTJ sensors that have a high sensitivity. This is usually achieved by producing sensors with as low a magnetic anisotropy as possible, so that the magnetization direction is easily changed in direction. With such low anisotropy, however, the variations from one MTJ to another become significant and difficult to control. Therefore, it is difficult to design MTJ sensors that can reliably and consistently detect small magnetized beads.

Given the increasing interest in the identification of biological molecules it is to be expected that there is a significant amount of prior art directed at the use of magnetic sensors (and other magnetic sensors) to provide this identification. An early disclosure of the use of magnetic labels to detect target molecules is to be found in Baselt (U.S. Pat. No. 5,981,297). Baselt describes a system for binding target molecules to recognition agents that are themselves covalently bound to the surface of a magnetic field sensor. The target molecules, as well as non-target molecules, are covalently bound to magnetizable particles. The magnetizable particles are preferably superparamagnetic iron-oxide impregnated polymer beads and the sensor is a magnetoresistive material. The detector can indicate the presence or absence of a target molecule while molecules that do not bind to the recognition agents (non-target molecules) are removed from the system by the application of a magnetic field.

A particularly detailed discussion of the detection scheme of the method is provided by Tondra (U.S. Pat. No. 6,875,621). Tondra teaches a ferromagnetic thin-film based GMR magnetic field sensor for detecting the presence of selected molecular species. Tondra also teaches methods for enhancing the sensitivity of magnetic sensor arrays that include the use of bridge circuits and series connections of multiple sensor stripes. Tondra teaches the use of paramagnetic beads that have very little intrinsic magnetic field and are magnetized by an external source after the target molecules have been captured.

Prinz et al. (U.S. Pat. No. 6,844,202 and U.S. Pat. No. 6,764,861) teaches the use of a magnetic sensing element in which a planar layer of electrically conducting ferromagnetic material has an initial state in which the material has a circular magnetic moment. In other respects, the sensor of Prinz fulfills the basic steps of binding at its surface with target molecules that are part of a fluid test medium. Unlike the GMR devices disclosed by Tondra above, the sensor of Prinz changes its magnetic moment from circular to radial under the influence of the fringing fields produced by the magnetized particles on the bound target molecules.

U.S. Pat. No. 7,031,186 and Patent Application 2004/0120185 (Kang et al) disclose a biosensor comprising MTJ elements.

U.S. Patent Application 2007/0159175 (Prinz) shows on-chip magnetic sensors to detect different types of magnetic particles or molecules.

U.S. Patent Application 2007/0114180 (Ramanathan et al) teaches MTJ channel detectors for magnetic nanoparticles.

U.S. Patent Application 2005/0100930 (Wang et al) discloses detection of biological cells and molecules.

None of the prior art inventions provide a robust method of reliably detecting the presence of individual beads. It is the object of the present invention to provide such a method.

SUMMARY OF THE INVENTION

A first object of this invention is to provide a method of determining the presence or absence of small magnetized particles.

A second object of this invention is to provide such a method that detects the aforementioned magnetized particles when they are bonded to chemical or biological molecules and when the chemical or biological molecules are themselves bonded to a substrate.

A third object of the present invention is to provide such a method that uses the magnetoresistive properties of an array of MTJ cells to detect the presence of such small magnetized particles.

A fourth object of the present invention is to provide such an array of MTJ cells that can reliably and conclusively indicate the presence of a small magnetized particle that is bonded in a given position relative to MTJ cells forming the array.

The objects of the present invention will be achieved by a sensor array design having the following characteristics, all of which are schematically illustrated in FIGS. 5 and 6 and will be discussed below in greater detail.

1. Referring to FIG. 5 there is schematically illustrated an overhead view of the general form of the sensor structure that fulfills the above objects. The structure consists of a substrate within which and beneath whose planar surface is a regular array of MTJ cells (60) formed at the orthogonal intersections of parallel word lines (200) and parallel bit lines (100) wherein the pitch of the array (the spacing between the parallel lines) is approximately equal to or less than the dimensions of the magnetic beads to be detected. An exemplary bead (10) is shown in a location that partially covers four MTJ cells. The stray magnetic field, shown as radially incoming arrows (550), within the array that is produced by a magnetized bead on the substrate can be detected by several MTJ cells in the array, as schematically illustrated in the figure. The free layers of these cells have their magnetizations (610) nominally directed as shown along the easy axis (the major axis) of each elliptically shaped cell.

2. Referring to FIG. 6, there is shown the bead and array of FIG. 5 with the addition of a line labeled X-Y passing through the bead and + and − signs to the left and right of this line respectively. These signs indicate that the in-plane components tangent to the MTJ layers (see (550) in FIG. 4) of the magnetic field produced by the bead have opposite polarities relative to the sensors that are to the left and right of the line. This "signature" of a bead, which will ultimately be detected through the determination of correlations between MTJ resistances can be used to authenticate the presence of a bead.

3. Referring again to FIG. 6, it can be seen that the X-Y axis dividing the cross-section of the bead will lie along the hard axis of the MTJ cell, which, if the anisotropy is shape induced, is along the minor axis (shorter axis) of the cell's elliptical shape. This is because the opposite field directions of the bead will generate signals of opposite polarity from the direction of the easy axis magnetization of the MTJ cell, but will lead to no measured effect relative to the hard axis of the MTJ cell.

In the description of the preferred embodiment given below, it will be shown how the bead signature can be used to detect the presence of a bead with reliability and reproducibility.

BRIEF DESCRIPTION OF THE DRAWINGS

The objects, features, and advantages of the present invention are understood within the context of the Description of the Preferred Embodiment as set forth below. The Description of the Preferred Embodiment is understood within the context of the accompanying figures, wherein:

FIG. 1 (prior art) is a schematic representation of a magnetic bead bonded to a target molecule and the target molecule bonded to a receptor site.

FIG. 2 (prior art) is a schematic cross-sectional representation of a magnetic sensor such as is positioned beneath the substrate of FIG. 1.

FIG. 3 (prior art) is a schematic illustration of an overhead view of the sensor of FIG. 2a, showing also the presence of an external field produced by a magnetized particle.

FIG. 4 (prior art) is a schematic perspective representation of a typical biased magnetic sensor stripe over which a magnetized particle is positioned.

DESCRIPTION OF THE PREFERRED EMBODIMENTS

The preferred embodiment of the present invention is a magnetic particle detecting magnetic sensor comprising a substrate containing a regular array of MTJ cells positioned at the orthogonal crossings of parallel rows of word lines and bit lines. The spacing between the rows is approximately equal to or less than the dimensions of a magnetized small superparamagnetic particle or bead whose presence is to be detected. The array is substantially beneath or within a planar substrate on whose surface is located binding sites that are receptors for a specific molecular target. The molecular target has already been bonded to the small superparamagnetic particle or bead. When the bead is subjected to an external magnetic field it produces its own induced magnetic field whose components within the plane of the MTJ free layer are capable of moving the magnetic moment of the free layers of nearby MTJ cells. The movement of these magnetic moments produce a detectable signal indicating resistance variations of the cells and the nature of the signal, when it shows that a certain correlation between the resistances of neighboring MTJ cells exists, is an unambiguous indication of the presence of a bound molecule and its attached magnetized bead.

Figure 5:
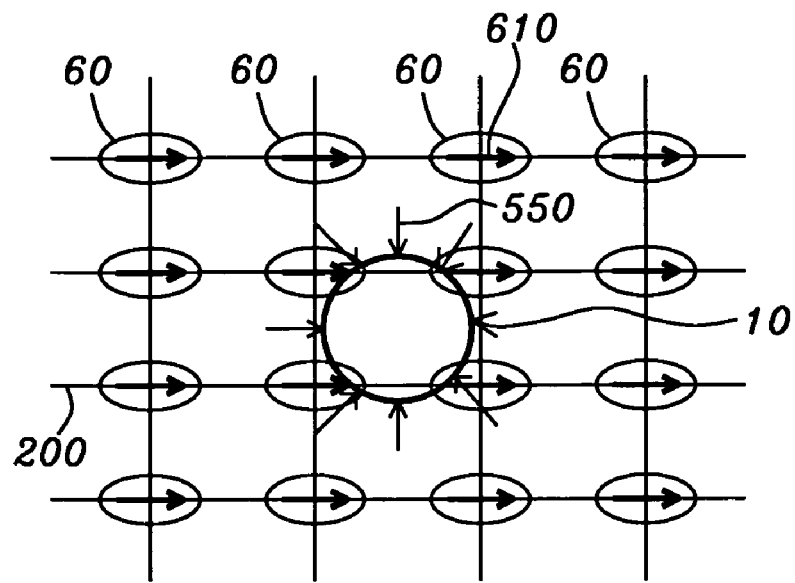
FIG. 5 is a schematic overhead view of a sensor array and a magnetized particle captured on the array.
Figure 6:
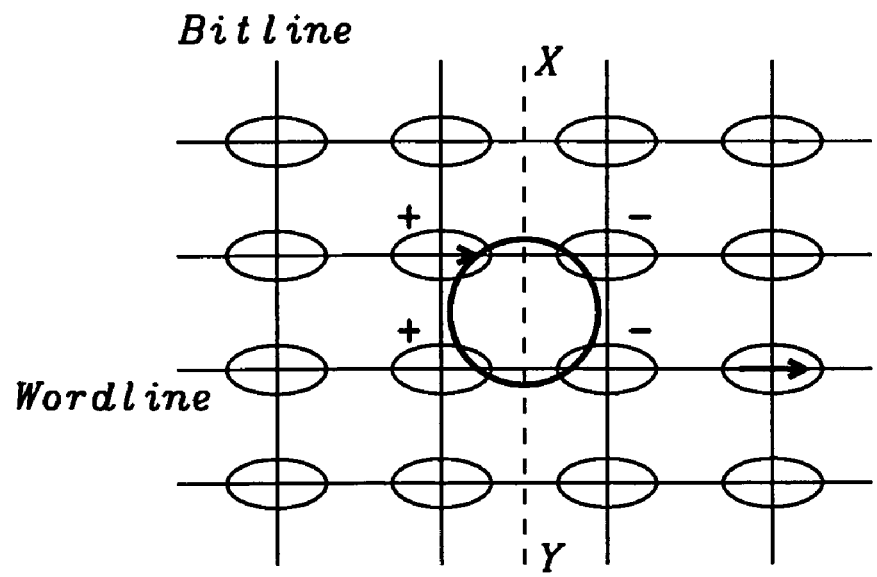
FIG. 6 is a schematic view of the array of FIG. 5 showing the polarities of the fields beneath the captured small particle.
Figure 7:
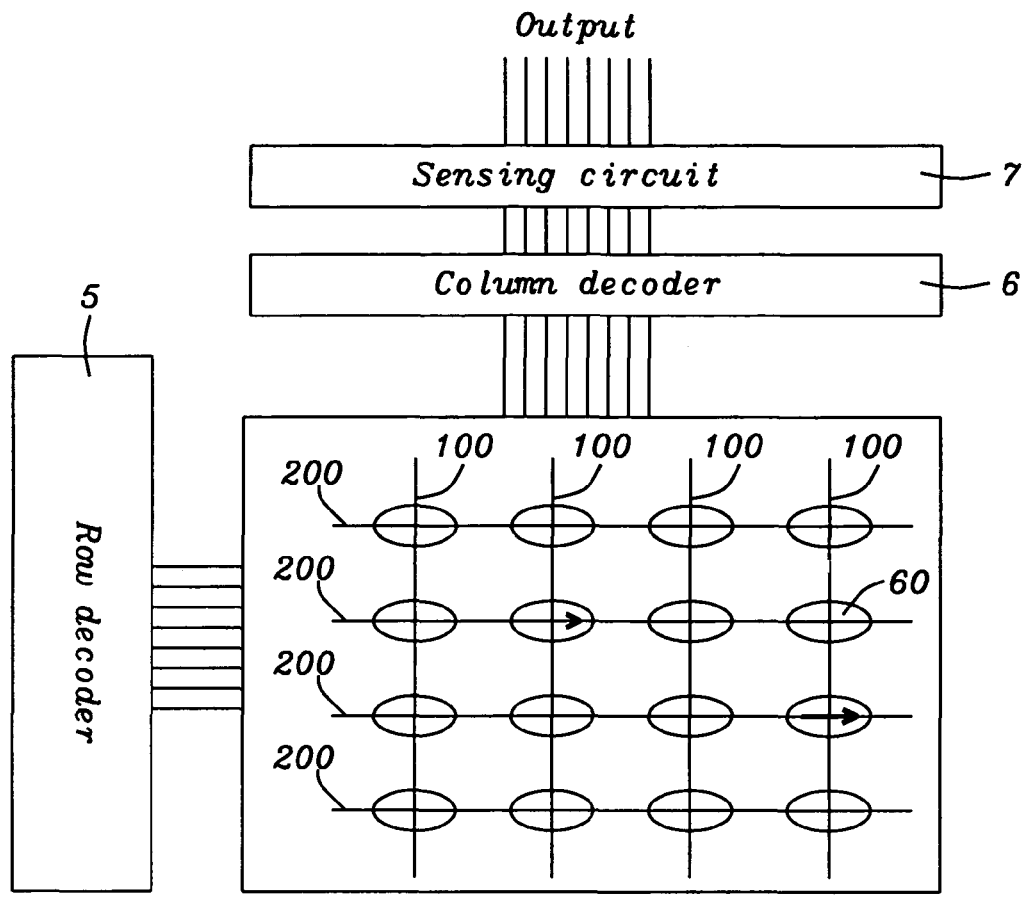
FIG. 7 is a schematic overhead view of a sensor array and the circuitry required to locate the position of a magnetized particle.

Referring to FIG. 7 there is shown a schematic illustration of an MTJ array such as that illustrated in FIG. 6 and FIG. 7 with the addition of the circuitry required to identify and locate a captured magnetized particle. The array includes a row (5) and column (6) decoder to identify the locations of MTJ cells in the array, measure their resistances and, thereby, determine which cells have been activated by the magnetic fields of a magnetized particle. The array also includes a sensing circuit (7) that interprets the signals from these decoders and indicates the location of a particle and outputs (80) its location.

The easy axis of each MTJ cell should be well defined. This can be achieved, for example, by patterning the cells to produce a shape anisotropy (as is shown here), such as the elliptically formed cells indicated in the previous figures and the present figure (60). However, for high sensitivity, the switching field threshold of the cell (the field required to flip the magnetization direction of a free layer from parallel to, to antiparallel to the magnetization direction of a pinned layer) should be as low as possible, preferably below 10 Oe. One way to reduce the switching field is to pattern the cells with circular cross-sectional shapes, thus eliminating shape anisotropy and to provide the required magnetic anisotropy through the deposition-produced crystalline anisotropy of the magnetic thin-film layers (film anisotropy) by the application of a magnetic field during an annealing process.

Figure 8:
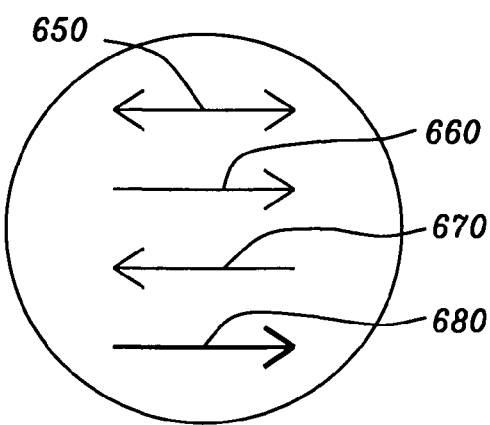
FIG. 8 is a schematic illustration of a free layer showing the various sources of field energy in the layer.

Referring to FIG. 8, there is shown a cell free layer of a preferred embodiment (indicating various magnetic fields that are of importance to its behavior), in which the easy axis direction is made the same as the magnetic moment direction of the cell pinned layer (shown as a heavy arrow) not necessarily by the imposition of a shape anisotropy. The free layer generally has three energy terms (energies of the layer corresponding to interactions between its various forms of magnetization and an arbitrary external magnetic field): $H_k$ (650), the intrinsic uniaxial anisotropy, is determined by magnetic field direction during layer deposition or subsequent annealing, it provides the magnetization in the absence of all other fields. The interlayer coupling field (660) between the free and pinned layers is due to surface interactions such as the "orange peel" coupling, and the demagnetization field (670) is produced by the field associated with the net magnetic moment (680) of the pinned layer. The magnetic moment of the pinned layer is chosen so that the interlayer coupling and the demagnetization field cancel each other. Therefore, the net anisotropy (and, thus, the switching field) of the free layer is largely the $H_k$ (650) of the deposited free layer materials. If the free layer material is carefully optimized, it is not difficult to achieve a switching field of a few Oe. For example, a free layer formed of permalloy can be made to have a switching field of <5 Oe.

Figure 9:
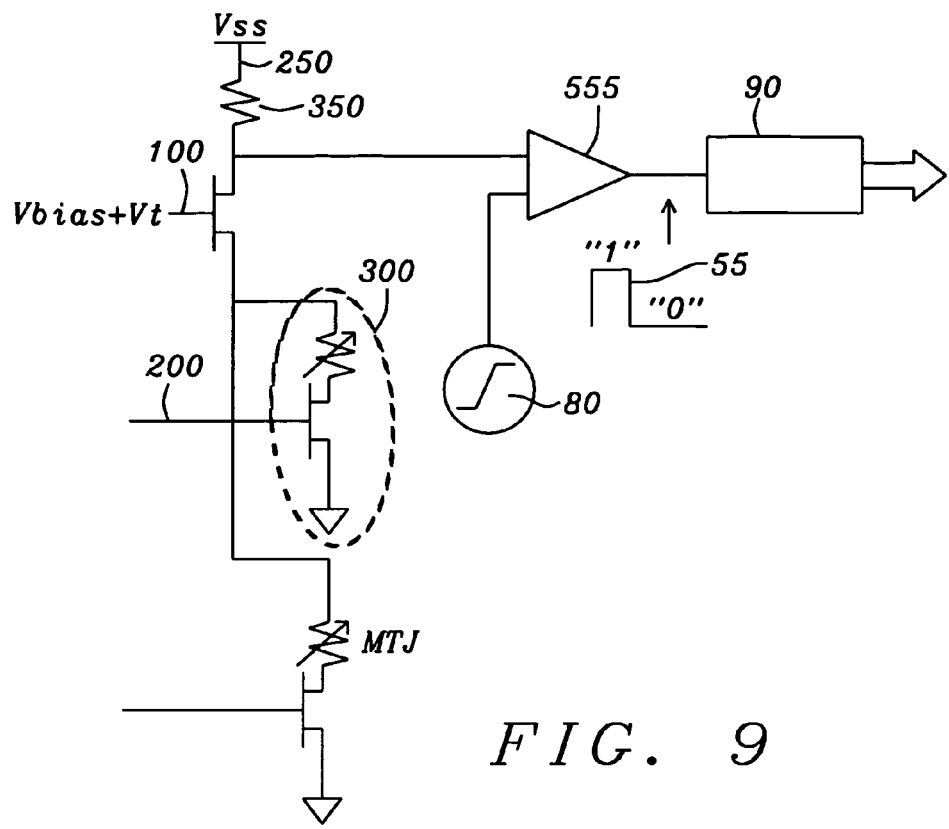
FIG. 9 is a schematic illustration of a circuit used to select and measure the resistance of a cell.

Referring to FIG. 9, there is shown a schematic illustration of a circuit to measure the resistance of an MTJ cell that is part of an array. The circuitry can be external to the array or can be integrated within the array itself. In general a bias voltage, $V_{bias}$, (plus an additional voltage $V_t$ to activate the transistor gate) or a bias current, is applied to a selected line of cells through a bit line (100). As a result, an MTJ sense current, $I_{sense}$, or the sense voltage, $V_{sense}$, it produces, is compared to a given reference. As shown in the figure, a selected word line (200) allows the sense current to pass through its contacted MTJ cell (300) shown encircled by a broken line. The sense current passes through the load resistor (350) of resistance R and thus produces a sense voltage of magnitude $V_{sense} = V_{ss} - RI_{sense}$ induced by the supply voltage $V_{ss}$ (250). This sense voltage is then passed to the comparator (555) which compares it to a known, variable, reference voltage $V_{ref}$ (80). The output (55) of the comparator flips when the reference voltage exceeds the sense voltage. In use, the reference voltage (80) starts below the voltage to be measured and the output of the comparator (555) starts at a corresponding value of "1". When the reference voltage reaches and surpasses the voltage to be measured, the comparator output switches to "0". The output can be integrated (90) and, through an analog-to-digital conversion, the resistance is obtained in a digital form. The measurement can be carried out on the array chip itself where noise management problems can be dealt with and where data analysis can be added. Moreover, the resistance measurements can be conducted in parallel, so that many bit lines can be measured at the same time. This can be done either on-chip or off-chip. In applications where a minimal number of external connector pins are desired, massively parallel internal measurements can be made and the results sent via a serial interface to external circuitry.

To detect the presence of a magnetic bead, an out-of-plane magnetic field can be applied perpendicularly to the MTJ array to induce a magnetization in the magnetic beads. Such a field was shown in FIG. 4. The resistances of the individual MTJ cells are then measured to detect the presence of an in-plane component of the field of the now magnetized bead (a field component in the plane of the free layer). Such an in-plane component can alter the position of the free layer magnetic moment and produce a measurable change in the MTJ cell resistance.

The MTJ response to an in-plane field can be separated into a response caused by two components of the in-plane field: a component along the free layer easy axis and a component along the free layer hard axis. As we shall see, these two components will produce different variations in the MTJ resistance. The typical response to these two components is as shown in FIGS. 10*a* and 10*b*.

Figure 10A:
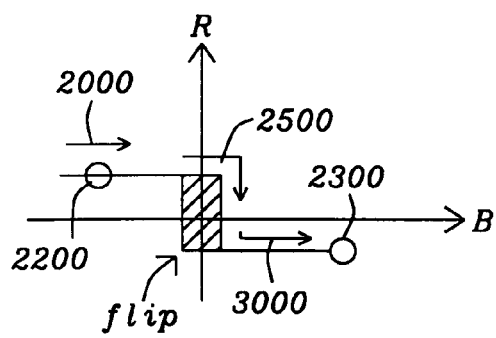
FIG. 10*a* and FIG. 10*b* are schematic illustrations of the response of a free layer to components of the induced field that are along the easy axis (10*a*) and along the hard axis (10*b*).
Figure 10B:
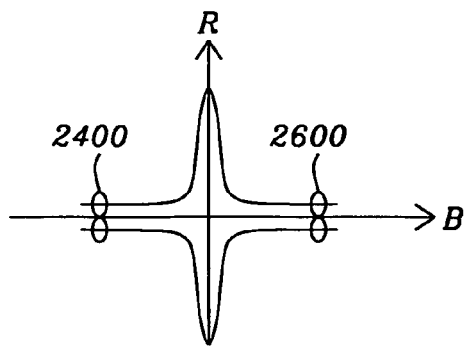

Referring to FIG. 10*a* and FIG. 10*b*, there is schematically shown how the results of a resistance measurement on an MTJ cell depends on the relative strengths of the hard axis component and easy axis component of the induced in-plane field of the bead. The figures will also indicate how changing the polarity of an externally applied magnetic field can allow a resistance variation to be measured in order to determine the presence of a magnetic particle.

The horizontal axis of the coordinate system in FIG. 10*a* represents the magnitude of the in-plane component of the particle's induced field along the free layer easy axis and the vertical axis of the coordinate system represents the resistance of the MTJ cell. FIG. 10*a* shows that the easy axis component of the field will either maintain a high resistance or maintain a low resistance (i.e., it will either reverse or not reverse the magnetization of the free layer) until a certain direction of the in-plane field will suddenly cause a resistance change. A horizontal arrow going from left to right indicates how the free layer flips its magnetization as the induced B field of the bead changes in polarity from being in the direction of the free layer magnetization (2000) to being opposite in direction (3000) and flipping at (2500). There is a small amount of hysteresis present (shaded region) to indicate that once a reversal has occurred, it will require slightly more field in the opposite direction to restore the initial magnetization direction. Thus, if an initial measurement of the resistance is made for a given initial external field polarity at the leftmost circle (2000), and then the external field polarity is changed and another resistance measurement is made at the rightmost circle (2300), and if these two resistance values are subtracted, a large value would be obtained for the difference in the two values. This is the difference that is measured and used to detect the presence of a particle.

Referring to FIG. 10*b*, there is shown the effects of the component of the in-plane field that is along the hard axis direction. The effect of this component has two branches, depending on the free layer magnetization direction in the absence of a hard axis field component. Looking at the upper branch at zero hard axis field component, where the magnetization of the free layer is opposite to the magnetization of the pinned layer, there is a maximum resistance value, $R_{max}$. It is seen that a hard-axis component can gradually tilt the free layer magnetization away from its easy axis direction until the magnetization approaches the hard axis direction, thus reaching a resistance value that is halfway between $R_{max}$ and $R_{min}$ at the leftmost circle (2400). When the hard axis component of the field is reversed, the opposite effect occurs as shown at the rightmost circle (2600).

Figure 11:
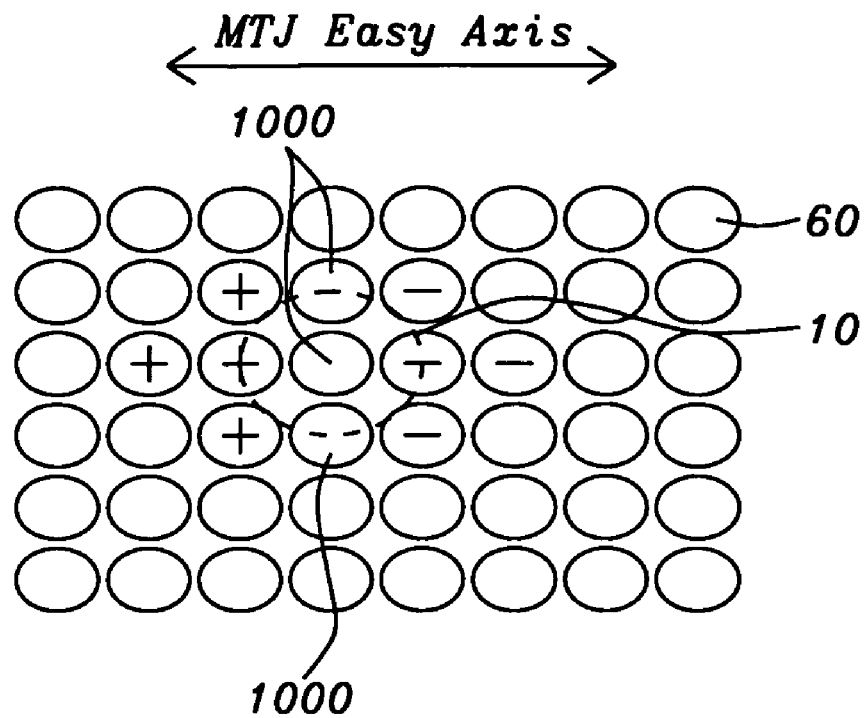
FIG. 11 is a schematic illustration of the signature of a particle.

A preferred way to measure and interpret the signal produced by the in-plane field of the magnetized bead is to change the polarity of the applied field and measure the differences in the two resistances of the cell. Thus, for example, one detects the resistance of the MTJ cell at a large final applied field that is of opposite polarity to the initial applied field and subtracts the two signals. The result of this subtraction, when carried out at an array of MTJ cells, is expected to give the signature illustrated schematically in FIG. 11 if a bead is actually present. In FIG. 11 there can be seen, schematically, a cluster of MTJ cells, labeled with + signs, that represent those cells giving a maximum resistance change. On the other side of the bead there is a cluster of cells labeled with − signs that also indicate cells having a maximum resistance change, but with opposite polarity. The three cells marked 1000 show no variation as they lie along the hard axis of the free layer. This distribution of measurable cell resistances provides a signature for a captured magnetized particle and such distributions can be located within the array of MTJ cells just described by successively addressing rows of bit lines and word lines and measuring the resistances of the MTJ cells along those lines using circuitry such as that described with reference to FIG. 6 and FIG. 7. It is noted that a distribution of multiple signatures corresponding to the capture of many beads can also be interpreted so that a multiplicity of beads can be detected and counted. The issue of identifying signatures of multiple beads can be addressed by generating such signatures for various bead configurations and storing those signatures for identification purposes. Thus, if a detected signature fails to satisfy criteria for the presence of a single bead, the signature can be successively compared to other signatures until a match is found.

There are applications where the in-plane magnetic field of the magnetic bead is too small to consistently switch the free layer magnetic moment of the MTJ cell free layer. This can be a result of too thick a layer of overcoat between the MTJ cells and the surface on which the bead resides, or a result of the beads being too small to supply a field of sufficient strength. In such cases, the following arrangement can be applied.

Figure 12:
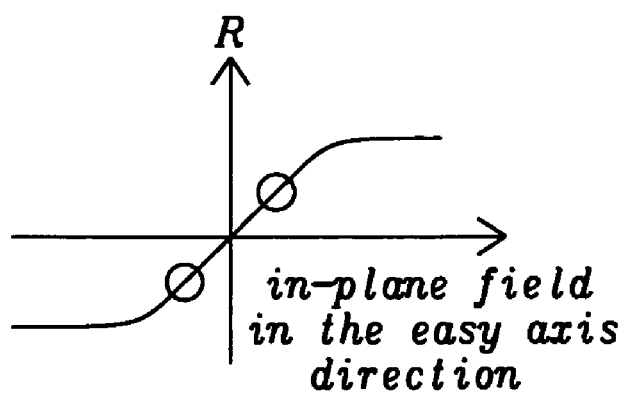
FIG. 12 is a schematic illustration of the response of a free layer to a biasing field plus the insufficient field of a magnetized particle.

Slightly increase the cell anisotropy such that both $H_c$ (the switching field) and $H_k$ (the anisotropy) are consistently larger than the in-plane components of the field of a captured particle. In addition, apply a bias field that is approximately equal to or slightly larger than the induced field produced by the magnetized beads. Since the bias field magnitude is larger than the induced in-plane field, the free layer magnetization will always rotate as a single domain in response to the field induced by the magnetic particle. If the particle's field is along the free layer hard axis, there will be no response from the MTJ. If the field is in the easy axis direction, there will be a response that is approximately linear (i.e., an approximately linear function of the angle between the in-plane field and the easy axis direction). Once again the distribution of resistance changes such as those described in FIG. 11 will be substantially obtained, so the identifiable signature of a bound particle remains the same. Referring to FIG. 12, there is shown a schematic diagram indicating the resistance of the MTJ cell as a function of in-plane easy axis component of the bead. Comparing this curve to the curve of FIG. 10*a*, there is seen that the flip of the easy axis magnetization of the free layer is more gradual than in FIG. 10*a* and that the hysteresis effect is now absent.

As is finally understood by a person skilled in the art, the preferred embodiments of the present invention are illustrative of the present invention rather than limiting of the present invention. Revisions and modifications may be made to methods, materials, structures and dimensions employed in forming and providing a magnetic sensor comprising an array of addressable MTJ cells, a method of measuring their resistances and an associated data analysis algorithm that permits the detection of small magnetized particles bound to the sensor array through a characteristic signature, while still forming and providing such a magnetic sensor and its method of formation in accord with the spirit and scope of the present invention as defined by the appended claims.

What is claimed is:
1. A magnetic sensor for the identification of a chemical or biological species to which are bonded small magnetized particles, by means of a characteristic signature produced by said magnetized particles, comprising:
   a substrate having a planar surface on which is formed a plurality of species binding sites;

a regular array of MTJ cells formed below said substrate surface, wherein each MTJ cell includes a planar free layer having an easy axis, a hard axis and a threshold switching field and wherein said free layer plane is parallel to said substrate plane;

an MTJ cell selection and resistance measuring circuit for addressing each said MTJ cell in said array and determining variations in the resistance of each said cell and generating a signal indicating said variations;

a signal analysis algorithm for identifying a particular correlation between cell resistance variations among two or more substantially neighboring MTJ cells in said regular array, wherein said resistance variations have been determined through the application of said cell selection and resistance measuring circuit; wherein, said particular correlation is generated by the presence of two clusters of MTJ resistance variations of approximately equal amplitude but of opposite sign and wherein said clusters are laterally disposed about a vertical axis aligned along said hard axis of an MTJ cell in said array; and wherein said correlation is the signature of a magnetic particle that is magnetized by an externally imposed magnetic field and whereby the presence of said signature is indicative of the presence of a species bonded to said surface, on which species said magnetized particle is bonded.

2. The magnetic sensor of claim 1 wherein said external magnetic field imposed on said magnetic particle is out of said substrate plane and has initial and final polarities that are opposite in sense.

3. The magnetic sensor of claim 1 wherein said magnetized particle produces a magnetic field at the locations of said MTJ cells whereby a component of said magnetic field tangent to the plane of said free layer equals or exceeds the magnitude of said threshold switching field.

4. The magnetic sensor of claim 1 wherein said species is a chemical or biological molecule which is itself bound to said substrate surface by a binding site that is specific to said molecule.

5. The magnetic sensor of claim 1 wherein said array is a rectangular array formed of MTJ cells located at the orthogonal intersections of a plurality of uniformly spaced parallel word lines with a plurality of uniformly spaced parallel bit lines that are directed orthogonally to said word lines.

6. The magnetic sensor of claim 5 wherein the spacings between said word lines is approximately equal to the spacings between said bit lines.

7. The magnetic sensor of claim 5 wherein the dimensions of said magnetized particles is approximately equal to or greater than said spacings.

8. The magnetic sensor of claim 1 wherein each said MTJ cell has a well defined easy axis with a switching threshold below 10 Oe and a hard axis that is substantially perpendicular to said easy axis.

9. The magnetic sensor of claim 1 wherein each said MTJ cell is formed of horizontal layers and includes a pinned layer, a free layer and an insulating layer formed between said free and said pinned layer and wherein said cell is patterned with an approximately circular horizontal cross section.

10. The magnetic sensor of claim 9 wherein said free layer has an easy axis whose direction is defined substantially by a magnetic anisotropy resulting from the inherent crystalline properties of the deposited and annealed layer.

11. The magnetic sensor of claim 10 wherein there is a cancellation between an interlayer coupling field between said free layer and said pinned layer and a demagnetization field produced by a magnetic moment of said, pinned layer, whereby said easy axis is determined by said free layer magnetic anisotropy.

12. The magnetic sensor of claim 10 wherein said MTJ cell has a switching threshold below approximately 10 Oe.

13. The magnetic sensor of claim 1 further including the presence of a magnetic biasing field along the direction of said hard axis wherein the magnitude of said biasing field is approximately equal to or larger than said threshold switching field and wherein said magnetized particle produces a magnetic field at the location of an MTJ cell wherein said magnetic field of said magnetized particle has a component tangent to the plane of said planar free layer that is less than the magnitude of said threshold switching field.

14. The magnetic sensor of claim 5 wherein a top surface of each MTJ cell is electrically connected to said conducting bit line and a bottom surface of each MTJ cell is electrically connected to a transistor whereby, upon activation of said transistor by said orthogonally directed word line, said MTJ cell can be selected and the resistance of said MTJ cell can be measured.

15. The magnetic sensor of claim 14 wherein the thickness of said conducting bit line is less than approximately ¼ of the diameter of said magnetized particle.

16. The magnetic sensor of claim 15 wherein the thickness of said substrate above said conducting bit line is less than the diameter of said magnetized particle.

17. The magnetic sensor of claim 1 wherein said resistance measuring circuitry includes a comparator and a varying reference voltage.

18. The magnetic sensor of claim 1 wherein said signal analyzing algorithm can distinguish between a single bound magnetized particle and a cluster of magnetized particles by means of stored criteria that recognize the presence of a said cluster by the number and distribution of magnetized particles therein.

19. A method to determine the presence of a chemical or biological species on the surface of a substrate comprising:

providing a planar substrate having bonding sites attached thereto that are specific to the bonding of said chemical or biological species;

bonding a small superparamagnetic particle to said chemical or biological species;

forming, beneath said substrate, a regular, orthogonal array of MTJ cells, each cell including an easily switchable free layer having an easy axis and a hard axis and wherein the pitch of the array is less than or equal to the dimensions of the superparamagnetic particle;

inducing a magnetic moment in said superparamagnetic particle wherein said moment is perpendicular to said substrate and whereby said superparamagnetic particle induces a magnetic field along said free layer that is of sufficient strength to switch said free layer;

determining a distribution of resistance variations of said MTJ cells;

identifying a signature correlation between resistance variations of clusters of MTJ cells, wherein said signature correlation detects the presence of two clusters of MTJ resistance variations of approximately equal amplitude but of opposite sign and wherein said clusters are laterally disposed about a vertical axis aligned along said hard axis of a free layer of an MTJ cell in said array, whereby the presence of said correlation denotes the presence of said superparamagnetic particle.

20. A method to determine the presence of a chemical or biological species on the surface of a substrate comprising:

providing a planar substrate having bonding sites attached thereto that are specific to the bonding of said chemical or biological species;

bonding a small superparamagnetic particle to said chemical or biological species;

forming, beneath said substrate, a regular, orthogonal array of MTJ cells, each cell including an easily switchable free layer having an easy axis and a hard axis and wherein the pitch of the array is less than or equal to the dimensions of the superparamagnetic particle;

imposing a magnetic bias field within said array, said bias field being directed along said hard axis of each said MTJ cell and said bias field having a magnitude that is greater than the switching field of said MTJ cells;

inducing a magnetic moment in said superparamagnetic particle wherein said moment is perpendicular to said substrate and whereby said superparamagnetic particle induces a magnetic field along said free layer that is of insufficient strength to switch said free layer;

combining the biasing field with the induced magnetic field of said superparamagnetic particle to create a field configuration that is of sufficient strength to vary the magnetic moment of said MTJ cells and to create resistance variations in said cells;

determining a distribution of resistance variations of said MTJ cells;

identifying a signature correlation between resistance variations of clusters of MTJ cells, wherein said signature correlation detects the presence of two clusters of MTJ resistance variations of approximately equal amplitude but of opposite sign and wherein said clusters are laterally disposed about a vertical axis aligned along said hard axis of a free layer of an MTJ cell in said array, whereby the presence of said correlation denotes the presence of said superparamagnetic particle.

21. The method of claim 19 wherein said resistance variations are created by changing the polarity of said induced magnetic field and subtracting the resistances of said MTJ cells as determined before and after said change in polarity.

22. The method of claim 20 wherein said resistance variations are created by changing the polarity of said induced magnetic field and subtracting the resistances of said MTJ cells as determined before and after said change in polarity.

23. The method of claim 20 wherein said array is a rectangular array formed of MTJ cells located at the orthogonal intersections of a plurality of uniformly spaced parallel word lines with a plurality of uniformly spaced parallel bit lines that are directed orthogonally to said word lines.

24. The method of claim 21 wherein said array is a rectangular array formed of MTJ cells located at the orthogonal intersections of a plurality of uniformly spaced parallel word lines with a plurality of uniformly spaced parallel bit lines that are directed orthogonally to said word lines.

25. The method of claim 23 wherein the spacings between said word lines is approximately equal to the spacings between said bit lines.

26. The method of claim 24 wherein the spacings between said word lines is approximately equal to the spacings between said bit lines.

27. The method of claim 25 wherein the dimensions of said magnetized particles is approximately equal to or greater than said spacings.

28. The method of claim 26 wherein the dimensions of said magnetized particles is approximately equal to or greater than said spacings.

29. The method of claim 19 wherein each said MTJ cell has a well defined easy axis with a switching threshold below 10 Oe and a hard axis that is substantially perpendicular to said easy axis.

30. The method of claim 20 wherein each said MTJ cell has a well defined easy axis with a switching threshold below 10 Oe and a hard axis that is substantially perpendicular to said easy axis.

31. The method of claim 19 wherein each said MTJ cell is formed of horizontal layers and includes a pinned layer, a free layer and an insulating layer formed between said free and said pinned layer and wherein said cell is patterned with an approximately circular horizontal cross section.

32. The method of claim 20 wherein each said MTJ cell is formed of horizontal layers and includes a pinned layer, a free layer and an insulating layer formed between said free and said pinned layer and wherein said cell is patterned with an approximately circular horizontal cross section.

33. The method of claim 19 wherein said free layer has an easy axis whose direction is defined substantially by a magnetic anisotropy resulting from the inherent crystalline properties of the deposited and annealed layer.

34. The method of claim 20 wherein said free layer has an easy axis whose direction is defined substantially by a magnetic anisotropy resulting from the inherent crystalline properties of the deposited and annealed layer.

35. The method of claim 19 wherein there is a substantial cancellation between an interlayer coupling field between said free layer and said pinned layer and a demagnetization field produced by a magnetic moment of said pinned layer, whereby said easy axis is determined by said free layer magnetic anisotropy.

36. The method of claim 20 wherein there is a substantial cancellation between an interlayer coupling field between said free layer and said pinned layer and a demagnetization field produced by a magnetic moment of said pinned layer, whereby said easy axis is determined by said free layer magnetic anisotropy.

37. The method of claim 19 wherein said MTJ cell has a switching threshold below approximately 10 Oe.

38. The method of claim 20 wherein said MTJ cell has a switching threshold below approximately 10 Oe.

39. The method of claim 19 wherein a top surface of each MTJ cell is electrically connected to a conducting bit line and a bottom surface of each MTJ cell is electrically connected to a transistor whereby, upon activation of said transistor by an orthogonally directed word line, said MTJ cell can be selected and the resistance of said MTJ cell can be measured.

40. The method of claim 20 wherein a top surface of each MTJ cell is electrically connected to a conducting bit line and a bottom surface of each MTJ cell is electrically connected to a transistor whereby, upon activation of said transistor by an orthogonally directed word line, said MTJ cell can be selected and the resistance of said MTJ cell can be measured.

41. The method of claim 40 wherein the thickness of said conducting bit line is less than approximately ¼ of the diameter of a magnetized particle whose presence is to be detected.

42. The method of claim 41 wherein the thickness of said conducting bit line is less than approximately ¼ of the diameter of a magnetized particle whose presence is to be detected.

* * * * *